(12) United States Patent
Schneider et al.

(10) Patent No.: US 6,261,408 B1
(45) Date of Patent: Jul. 17, 2001

(54) METHOD AND APPARATUS FOR SEMICONDUCTOR PROCESSING CHAMBER PRESSURE CONTROL

(75) Inventors: Gerhard Schneider, Cupertino; Andrew Nguyen, San Jose, both of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/505,576

(22) Filed: Feb. 16, 2000

(51) Int. Cl.$^7$ .............................. C23C 16/00; H01L 21/00
(52) U.S. Cl. .................. 156/345; 118/715; 118/723 E
(58) Field of Search .................. 118/715, 723 E; 156/345

(56) References Cited

U.S. PATENT DOCUMENTS 5,707,486 * 1/1998 Collins ................................. 156/345

* cited by examiner

*Primary Examiner*—Richard Bueker
(74) *Attorney, Agent, or Firm*—Thomason Moser Patterson

(57) ABSTRACT

A pressure controlled substrate processing chamber comprising a pressure control ring and a throttling ridge. The pressure control ring is movably disposed proximate the throttling ridge to define a variable flow orifice. The pressure control ring is translated by a ring actuator in response to pressure information retrieved from the processing chamber. The translation of the pressure control ring causes the size of the orifice to change, thus inducing a pressure change within the chamber.

21 Claims, 8 Drawing Sheets

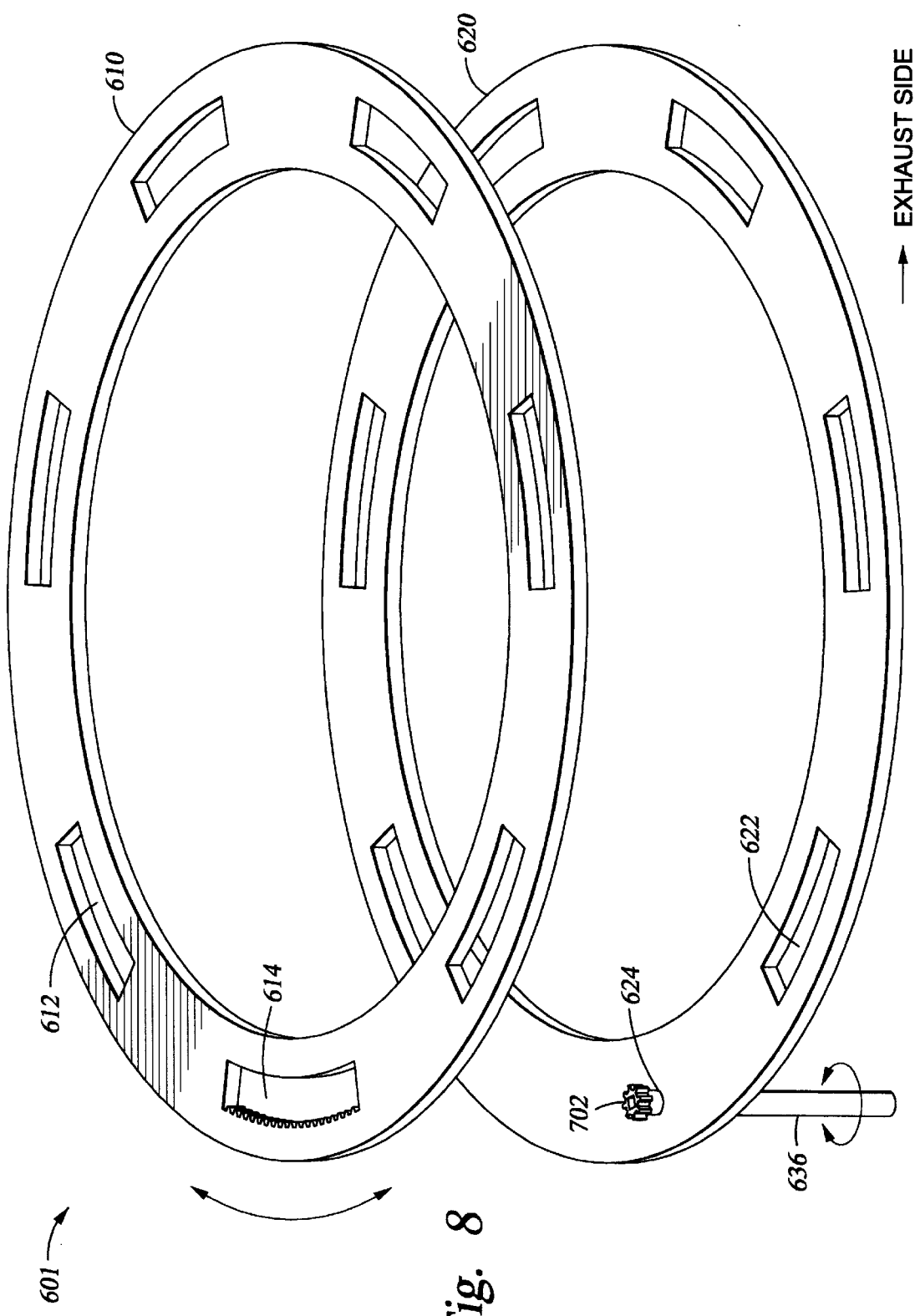

METHOD AND APPARATUS FOR SEMICONDUCTOR PROCESSING CHAMBER PRESSURE CONTROL

BACKGROUND OF THE DISCLOSURE

1. Field of Invention

The present invention relates generally to a semiconductor substrate processing apparatus. More specifically, the invention relates to an apparatus and method for providing pressure control within a semiconductor processing chamber.

2. Background of the Invention

In plasma processing of semiconductor substrates, certain processing steps require the regulation of chamber pressures and removal of gases and process residues from a processing chamber. Typically, pressure regulation and the removal of such gases and process residues are facilitated through the use of a vacuum pump and throttle valve coupled to an exhaust port of the processing chamber.

FIG. 1 depicts an exemplary semiconductor substrate processing system 10 having a throttle valve 38 and vacuum pump 40. An example of such a chamber is described by Collins in U.S. Pat. No. 5,707,486, issued Jan. 13, 1998.

The processing system 10 comprises a process chamber 44 having a bottom 26, sidewalls 24, and a lid 22 that define a chamber volume 12. A substrate support pedestal 18 is disposed in the process chamber 44 and supports a workpiece or substrate 20 (i.e., a wafer). Generally, a gas supply 42 is coupled to the process chamber 44 via one or more ports positioned either in the lid 22 or sidewalls 24. The gas supply 42 provides process and other gases to a processing region 14 above the substrate 20.

The chamber volume 12 is evacuated via the vacuum pump 40 coupled to the process chamber 44 typically through an exhaust port 36 positioned below the level of the substrate 20. The throttle valve 38 is coupled disposed between the process chamber 44 and the vacuum pump 40. A pressure control volume 46 is defined as the internal volume of the process chamber 44 upstream of the throttle valve 38. Generally, on typical systems, the chamber volume 12 and the pressure control volume 46 are substantially identical. Pressure is regulated within the process chamber 44 by actuating the throttle valve 38. Changes to the chamber pressure effectuated by the throttle valve 38 are propagated through the entire pressure control volume 46.

Although pressure control using the system described above has proven to be robust, the large size of the pressure control volume delays changes in chamber pressure in response to pressure control measures (i.e., such as throttle valve actuation). Additionally, since the pressure control volume is substantially equal to the chamber volume, the resonance time of gases within the chamber is long. Long resonance times of etchants result in other components within the chamber having to be replaced frequently (i.e., high cost of consumables) while long resonance times of reaction by-products may contribute to chamber and wafer contamination. Moreover, large volumes generally require more gases to obtain desired process concentrations, longer purge times, and greater processing cost.

Therefore, there is a need for an apparatus that facilitates pressure control in a semiconductor processing chamber while reducing the volume of the pressure control region.

SUMMARY OF THE INVENTION

Generally, the present invention provides a processing chamber comprising a pressure control ring and a throttling ridge. The pressure control ring is movably disposed proximate the throttling ridge to define an adjustable flow control orifice. The pressure control ring is connected to a ring actuator. The position of the control ring is controlled via a controller. The controller, in response to a process routine and a signal indicative of chamber pressure, causes the ring actuator to move the pressure control ring, consequently varying the area of the control orifice, and thus maintaining the chamber pressure at a predetermined value.

A method for controlling processing chamber pressure is also disclosed. Generally, the inventive method comprises the steps of sensing a pressure within a processing chamber; translating a ring within the processing chamber in response to the sensed pressure, the translation increasing or decreasing a flow restriction past the ring, the change in flow having a corresponding change in chamber pressure; and repeating the sensing and translating steps to maintain the sensed pressure substantially equal to a predetermined pressure value.

BRIEF DESCRIPTION OF DRAWINGS

The teachings of the present invention can be readily understood by considering the following detailed description in conjunction with the accompanying drawings, in which:

FIG. 8 is an exploded view of the pressure control ring of FIG. 7.

To facilitate understanding, identical reference numerals have been used, where possible, to designate identical elements that are common to the figures.

DETAIL DESCRIPTION OF INVENTION

The present invention generally provides an apparatus for controlling chamber pressure within a semiconductor substrate processing system. The invention is illustratively described below as an etch chamber. However, it should be understood that the description applies to other chamber configurations such as physical vapor deposition chambers, chemical vapor deposition chambers and any other chamber in which control of pressure within a chamber is desired.

Figure 1:
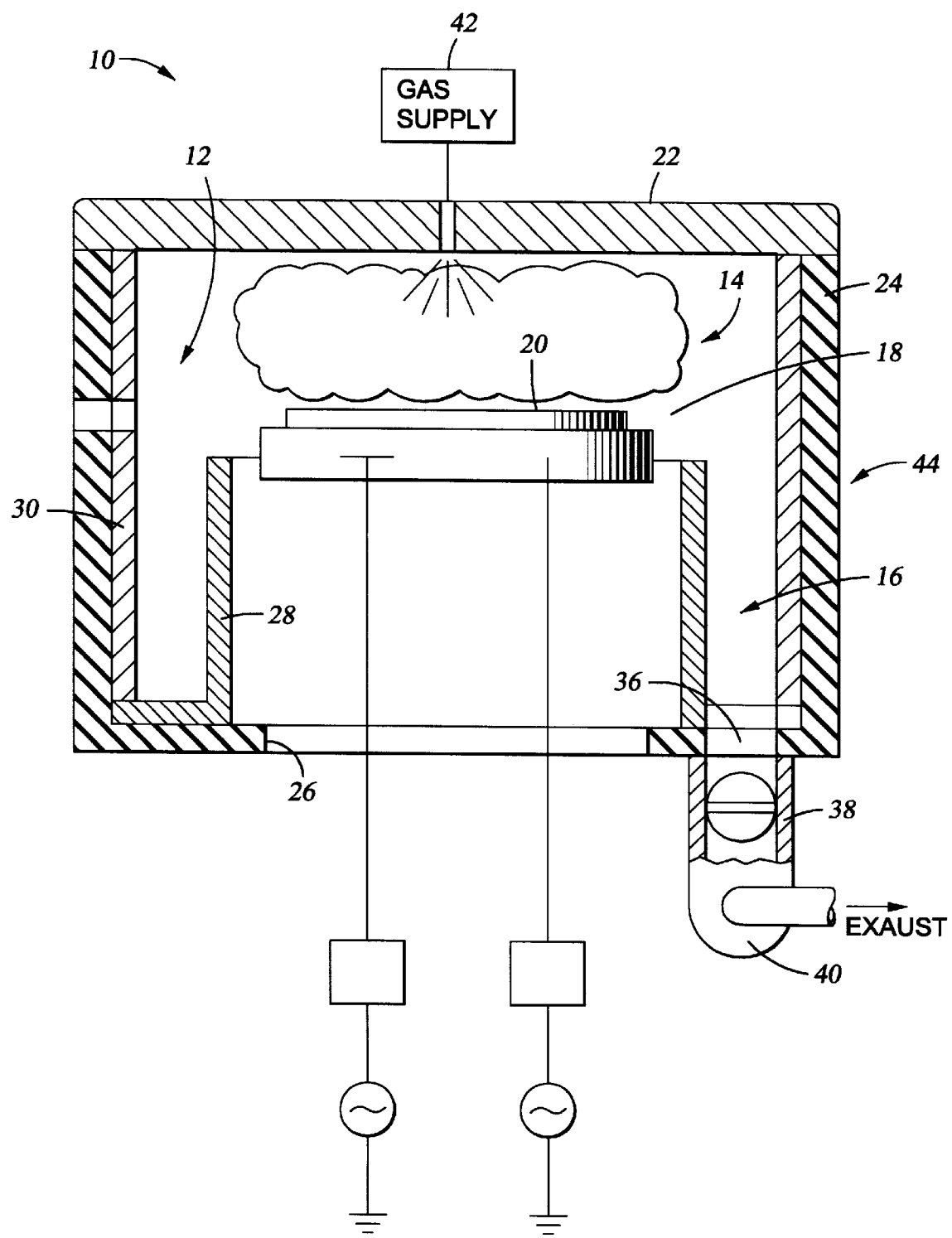
FIG. 1 is a simplified cross-sectional schematic view of a semiconductor substrate processing system of the prior art.
Figure 2:
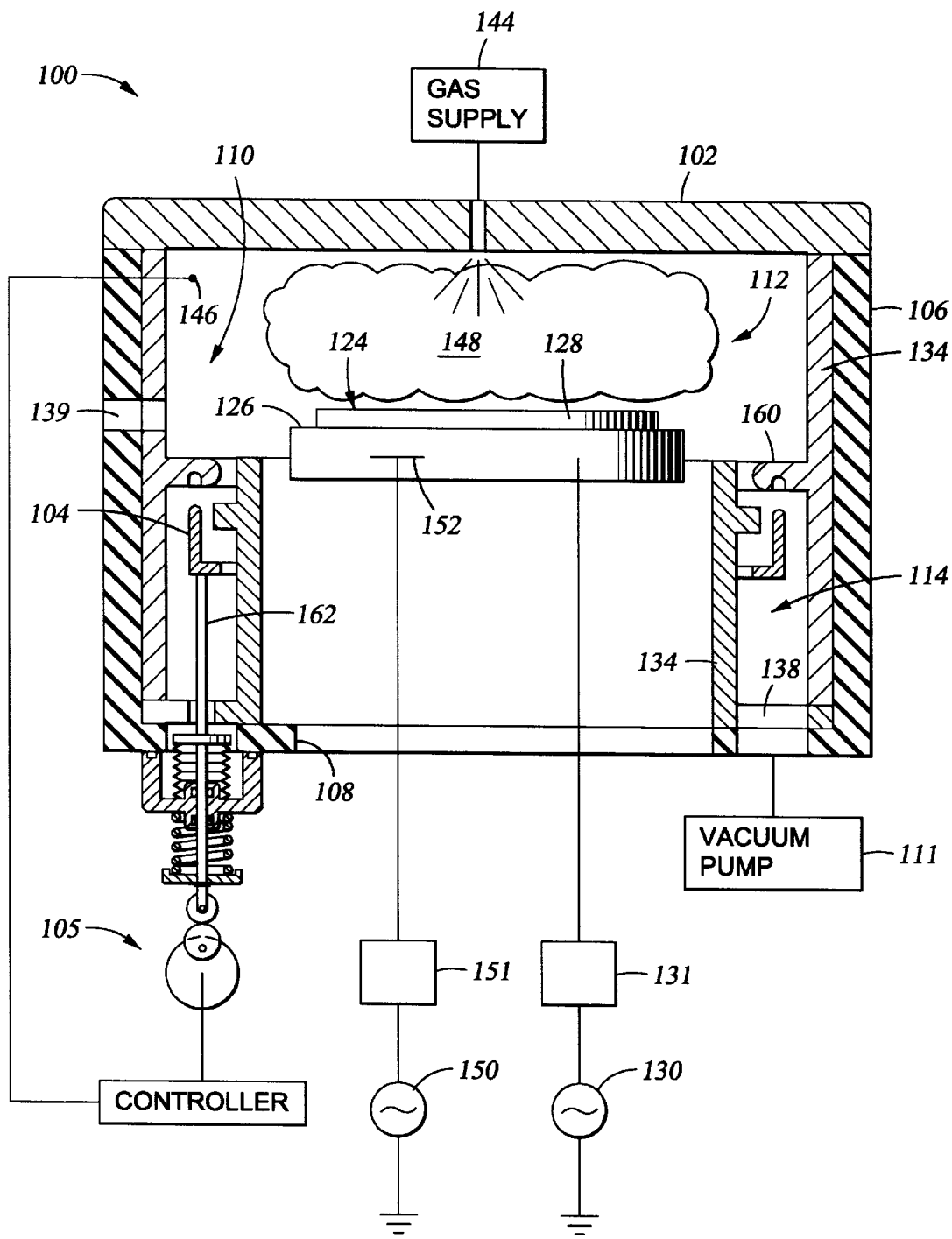
FIG. 2 is a simplified cross-sectional schematic view of a semiconductor substrate processing system having a pressure control ring and ring actuator.

FIG. 2 is a cross sectional view of one embodiment of an etch chamber 100 of the present invention having a pressure control ring 104 configured as a parallel plate etch reactor. However, other chambers and configurations are contemplated by the inventor. Generally, the pressure control ring 104 is movably connected to a ring actuator 105, preferably residing outside of the chamber 100.

The chamber 100 generally includes an annular sidewall 106, a bottom wall 108, and a lid 102 that define a chamber volume 110. Generally, the chamber volume 110 is bifurcated by the control ring 104 into a process volume 112 (the upper region of the chamber) and a pumping volume 114 (the lower region of the chamber).

The sidewall 106 includes a port 139 through which substrates 128 enter and exit the chamber 100. The bottom wall 108 has a pumping port (or exhaust port) 138 through which excess process gases and volatile compounds produced during processing are exhausted from the chamber 100 by a vacuum pump 111.

A substrate support 124, operating as a cathode, is disposed in the cathode portion of the chamber 100. The substrate support 124 has a support surface 126 upon which a substrate 128 is positioned during processing. The substrate support 124 is connected through a matching network 131 to a cathode power supply 130 that typically biases the substrate support 124 to a negative voltage. A protective edge ring 132 is disposed on the support surface 126 of the substrate support 124 and defines a perimeter in which the substrate 128 is positioned during processing.

An RF power supply 150 supplies electrical power through a first impedance matching network 151 to the one or more electrodes 152 embedded within the substrate support 124. The RF current through the electrodes 152 produces an RF electromagnetic field in the processing volume 112 between the lid 102 and the substrate support 124 so as to couple RF power to form a plasma 148 from process and other gases. The RF power enhances the density of the plasma 148.

The lid 102 is sealed by the sidewall 106. The lid 102 has a port coupled to a gas supply 144 for providing process gas (and other gases) to the process region 112 of the chamber 100. Alternately, gas may be supplied to the process region 112 from other locations, for example, through ports in the sidewall 106.

A first liner 118 and a second liner 134 are disposed within the chamber 100. The first liner 118 and the second liner 134 provide a removable surface on which deposition and other unwanted processing side effects can occur during processing. The first liner 118 and the second liner 134 are easily removed for cleaning or replacement upon removal of the lid 102. The first liner 118 and the second liner 134 may be alternately used singularly or in concert with each other as shown in FIG. 2.

The first liner 118 is disposed on the chamber bottom 108 surrounding the substrate support 124. The first liner 118 has an aperture that aligns with the exhaust port 138. The first liner may additionally contain a number of other ports for various purposes.

The second liner 134 is disposed along the sidewalls 106 proximate the lid 102. The second liner 134 has a substrate access port that aligns with the slit opening 139 in the sidewall 106 and may also contain a port to facilitate connection of the pressure control ring 104 and the ring actuator 105. The second liner 134 may additional other ports for various purposes. An example of such ports is a port for a pressure sensor 146 for obtaining an indicia of chamber pressure.

A throttling ridge 160 is disposed along the chamber sidewalls 106. In one embodiment, the throttling ridge 160 projects from the second liner 118 between the second liner 118 and the substrate support 124. In other embodiments, the throttling ridge may extend from the chamber sidewalls 106, the first liner 134 or the substrate support 124.

The pressure control ring 104 is disposed in the chamber 100 proximate the throttling ridge 160 and is positioned between the throttling ridge 160 and the chamber bottom 108. The pressure control ring 104 is movably coupled to the ring actuator 105 via a rod assembly 162.

Figure 3:
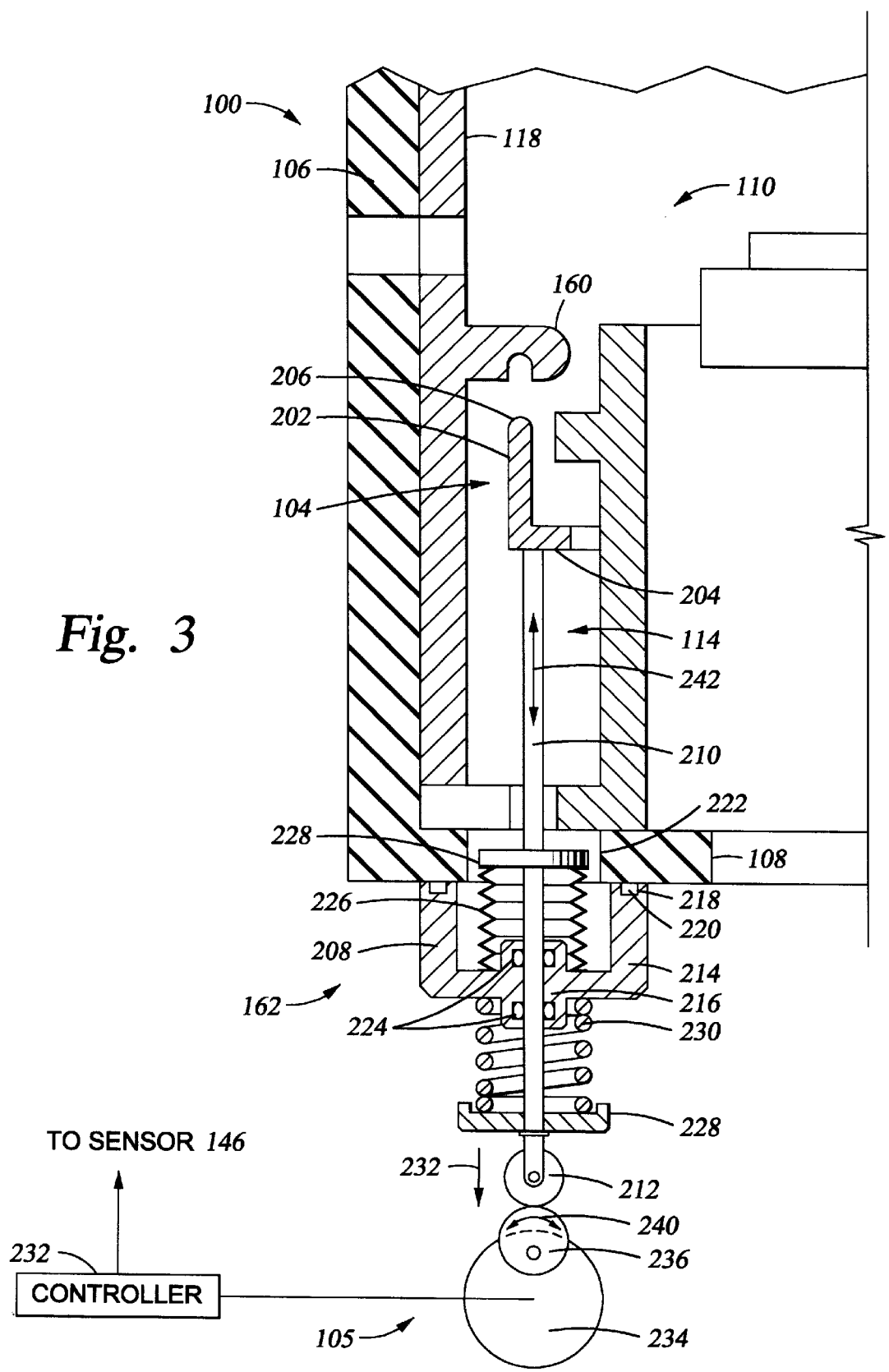
FIG. 3 is an enlarged view of a portion of the semiconductor substrate processing system of FIG. 2 illustrating the pressure control ring and the ring actuator.

FIG. 3 depicts the pressure control ring 104, the ring actuator 105 and rod assembly 162. In one embodiment, the pressure control ring 104 is aluminum, however other materials may be preferred such as silicon carbide, silicon, quartz and others as required by process material compatibility. The pressure control ring 104 has a first member 202 connected to a second member 204, forming an "L" cross-section. The first member 202 terminates in an end 206.

The rod assembly 162 comprises a housing 208, a rod 210, a and cam follower 212. The housing 208 is partially disposed in a hole 222 that extends through the chamber bottom 108 into the pumping volume 114. The housing 208 has a flange 214 that extends from a center body 216 and seats against the exterior of the chamber bottom 108. The flange 214 has an o-ring groove 218 in which is disposed an o-ring 220 that provides a seal between the bottom wall 108 of the chamber 100 and the rod assembly 162. The center body 216 has a pair of bushings 224 that allow the rod 210 to travel axially through the center body 216. A bellows 226 provides a flexible seal between a flange 228 extending from the rod 210 and the flange 214. The bellows 226 and o-ring 220 collectively isolate the pumping volume 114 from the atmosphere outside the chamber 100.

The rod 210 is coupled to the second member 204 of the pressure control ring 104 at one end and terminates in the cam follower 212 at the other end. The rod 210 is fabricated from stainless steel or other suitable material compatible with the processing environment. The rod 210 has a spring retainer 228 affixed to the rod 210 above the cam follower 212. A spring 230 is disposed about the rod 210 between the spring retainer 228 and the flange 214 of the housing 208. The spring 230 generates a biasing force that causes the rod 210 to be urged as indicated by arrow 232, causing the cam follower 212 to remain in contact with the ring actuator 105.

The ring actuator 105 comprises a stepper motor 234, a cam 236 and a controller 238. The stepper motor 234 rotationally drives cam 236. The stepper motor 234 is coupled to the controller 238. The controller 238, upon execution of a routine that utilizes pressure information provided by the sensor 146, causes the stepper motor 234 to rotate the cam 236. The lobes of the cam 236 in concert with the cam follower 212, transfers rotational motion (see arrow 240) provided by the stepper motor 234 into translational motion of the rod 210 and pressure control ring 104 (see arrow 242). Alternately, other motion control devices such as ball screws, rod and cylinders, solenoids and other translational motion mechanisms may be substituted for the ring actuator 105 and rod assembly 162 to control the motion of the pressure control ring 104.

Figure 4:
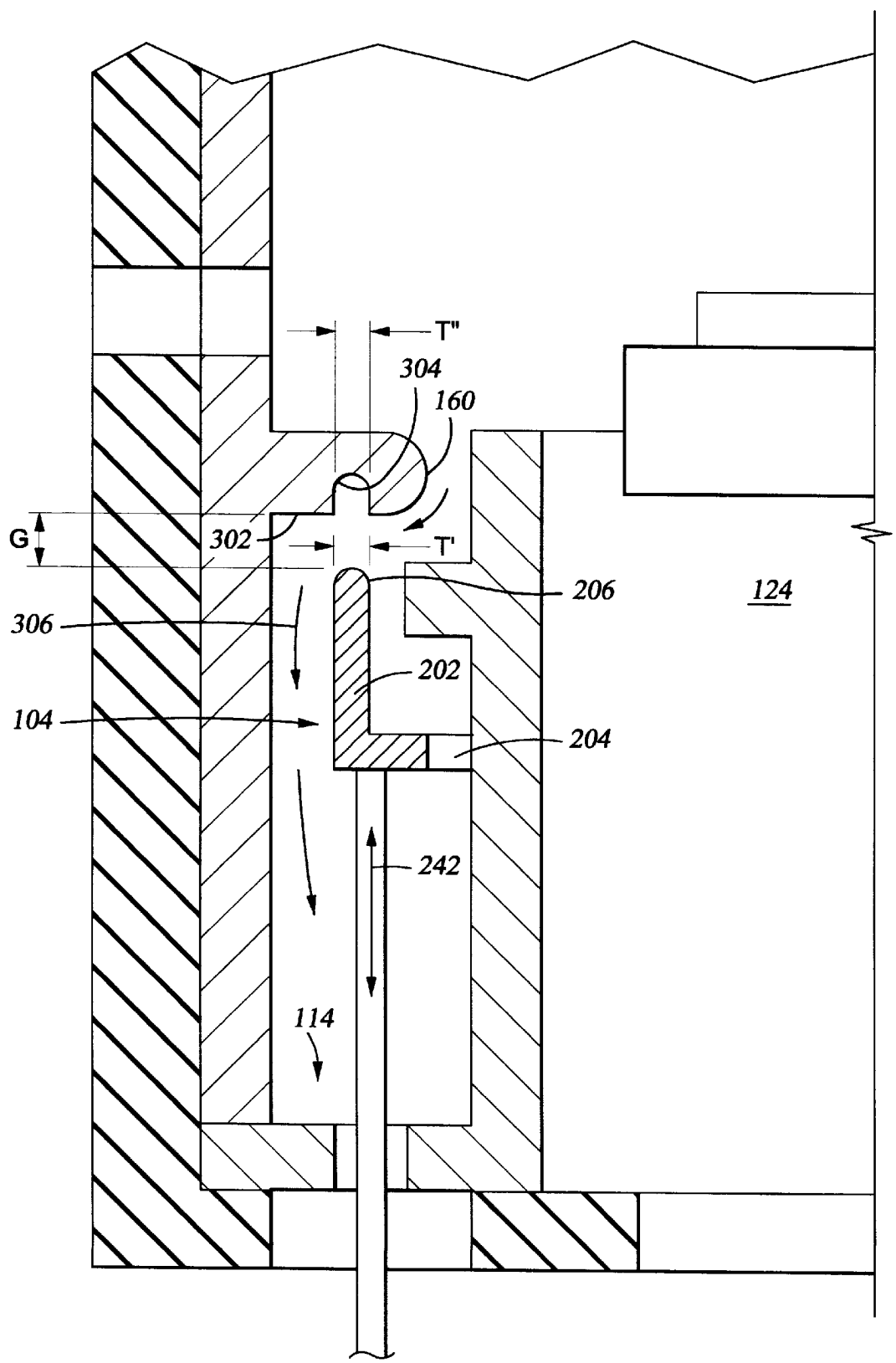
FIG. 4 is a detailed view of a portion of a throttling ridge depicted in FIG. 3 illustrating an optional recess.

The pressure control features of the present invention are best understood while referring to FIG. 4. The end 206 of the pressure control ring 104 and a side 302 of the throttling ridge 160 define an adjustable, annular gap "G" therebetween. The majority of the process and other gases pass through the gap G while being pumped out of the chamber 100 as depicted by arrow 306. Thus, the gap G becomes a flow control orifice for the gases being pumped out of the chamber 100. As the distance between the pressure control ring 104 and the throttling ridge 160 is varied by the movement of the pressure control ring 104 (see arrow 242), the cross sectional area of the gap G respectively increases or decreases. The change in the area of the gap G varies the restriction of the gases flowing through the gap G. The regulation of gas flow by the pressure control ring 104 causes a pressure control volume of the chamber volume 110 to be confined between the pressure control ring 104 and the lid 102. Additionally, as the pressure on the pressure control ring 104 primarily acts circumferentially upon the first member 202 as the flow passes through the gap G, the pressure control ring 104 may be actuated vertically with minimal force.

Figure 5:
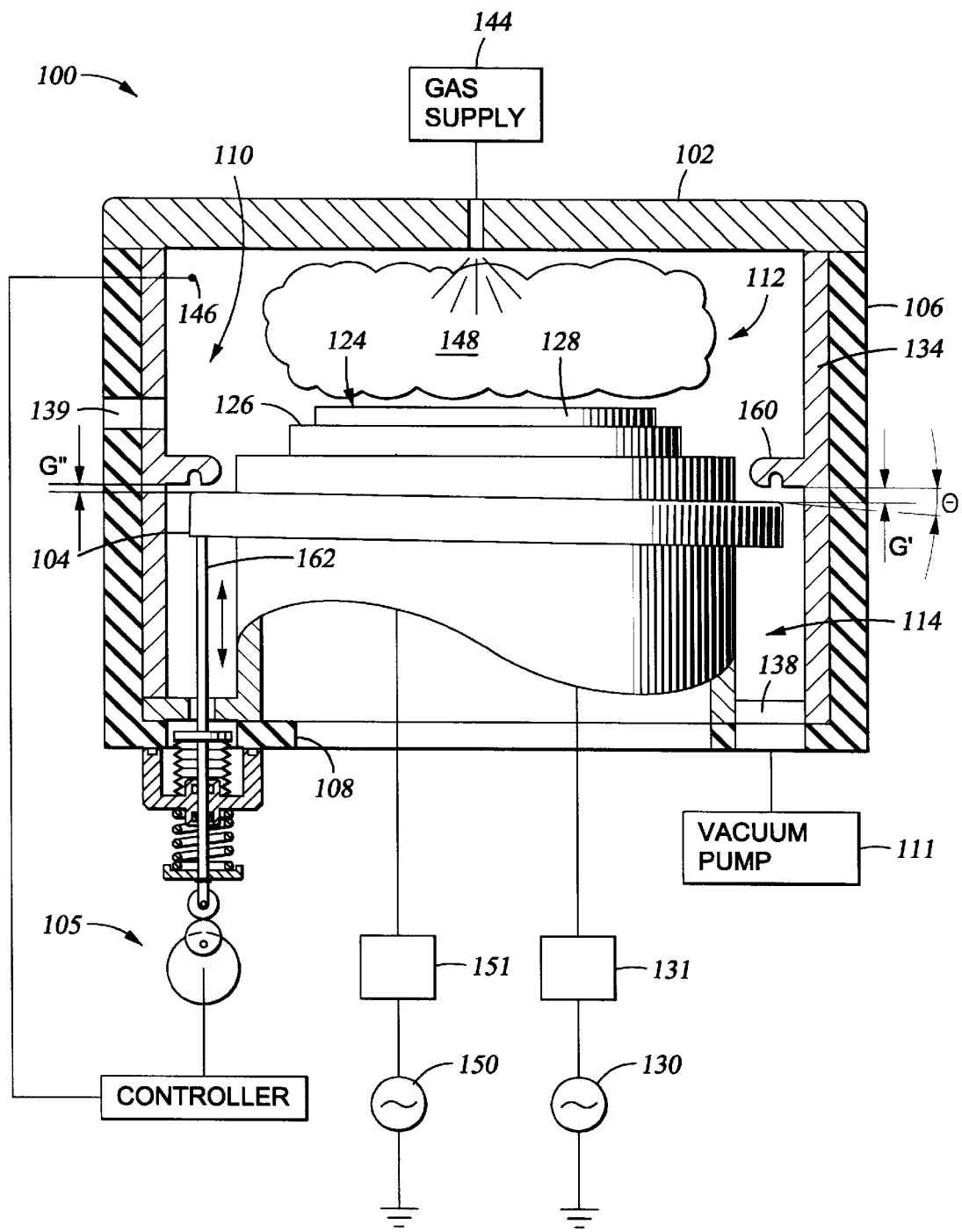
FIG. 5 is another embodiment of a semiconductor processing system having a pressure control ring orientated at angle to a throttling ridge.

Generally, the pressure control ring 104 is orientated substantially parallel to the throttling ridge 160. However, in other embodiments, the pressure control ring 104 is orientated at an angle θ to the throttling ridge 160 as depicted in FIG. 5. The angular orientation of the pressure control ring 104 provides a non-uniform gap (i.e., the distance between the throttling ridge 160 and the pressure control ring 104 varies along the perimeter of the pressure control ring 104). The non-uniform gap produces a non-uniform restriction in the gas flow between the throttling ridge 160 and control ring 104. The non-uniform restriction may be used to compensate for other flow factors that promote non-uniform gas movement within the chamber 100. For example, the angular orientation of the pressure control ring 104 creates a larger gap G' opposite the exhaust port 138 and a smaller gap G" above the exhaust port 138. Variation between the G' and G" increases the flow restriction proximate the exhaust port 138 that compensates for otherwise increased gas flow in the region of the chamber 100 closes the exhaust port 138, thus maintaining a uniform gas flow within the processing volume 112.

Referring back to FIG. 4, an alternate pressure control feature is the inclusion of an optional recess 304 in the surface 302 of the throttling ridge 160. The recess 304 has a width T". The recess 304 mates with the end 206. As the end 206 has a width T' which is less than T", the end 206 does not contact the throttling ridge 160 when the end 206 and recess 304 are mated. The lack of contact prevents particulate generation while maximizing the flow restriction. When the end 206 is mated with the recess 304, the area of the gap "G" is essentially zero, and high pressures may be obtained in the process volume 112. The recess 304 may also be used in embodiments utilizing an angular orientation of the pressure control ring 104 and the throttling ridge 160.

Figure 6:
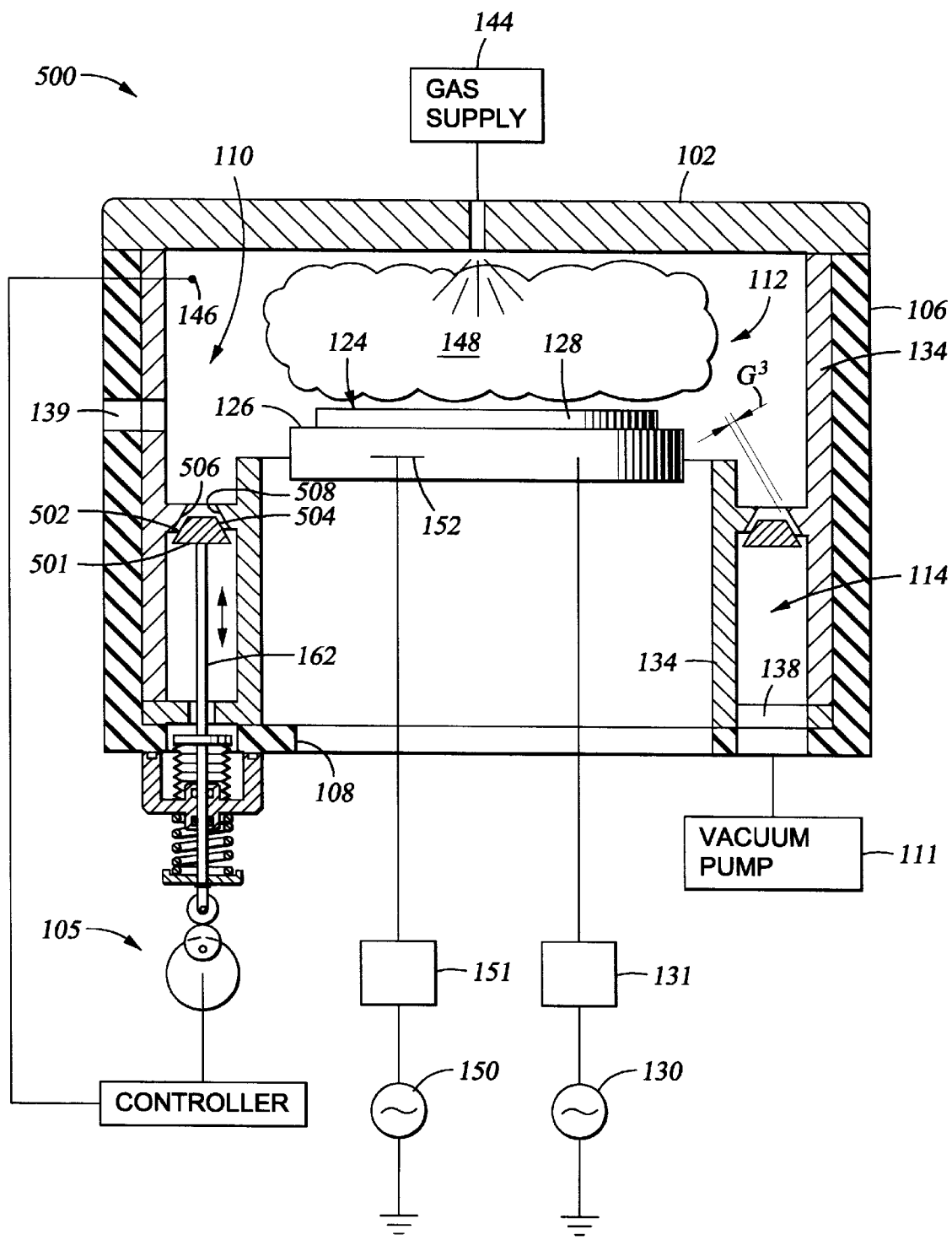
FIG. 6 is another embodiment of a semiconductor processing system having a pressure control ring.

FIG. 6 depicts an alternative embodiment of a processing system 500 containing a pressure control ring 501. The control ring 501 has a trapezoidal cross-section. The control ring 501 has a first side wall 502 and a second side wall 504. The first side wall 502 faces a parallel facing wall 506 that projects from the second liner 134. The second side wall 504 faces a second facing wall 508 that projects from the first liner 118. The distance between the side walls (502 and 504) and the facing walls (506 and 508) define a variable gap "$G^3$". When the pressure control ring 501 is in a raised position, the first and second side walls 502 and 504 are disposed respectively proximate the first and second facing walls 506 and 508 such that the gap $G^3$ is minimized, or optionally closed. As the pressure control ring 104 is lowered, the $G^3$ increases to allow greater gas flow between the pressure control ring 104 and the first and second liners 118 and 134.

Figure 7:
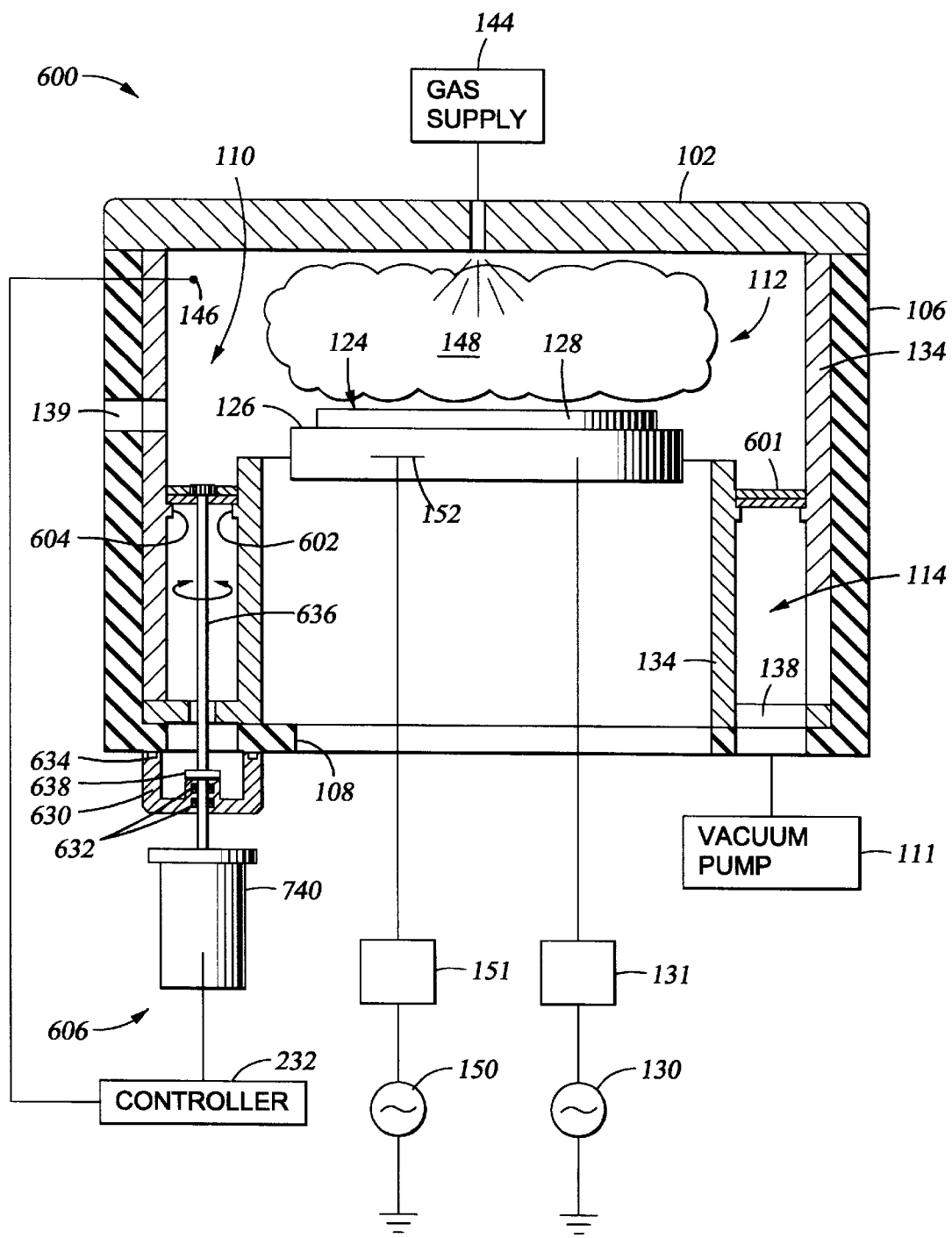
FIG. 7 is another embodiment of a semiconductor processing system having a pressure control ring.

FIGS. 7 and 8 depict another embodiment of a process chamber 600 having a pressure control ring 601 disposed around a substrate support 124. The pressure control ring 601 is disposed on a first ridge 602 extending from the first liner 118 and a second ridge 604 extending from the second liner 134.

The pressure control ring 601 is coupled to a rod 636 that passes through the chamber bottom 108. A housing 630 is sealed by o-rings 634 to the chamber bottom 108 and contains o-rings 623 which dynamically seal the housing 630 to the rod 636. The rod 636 has a flange 638 that rests on the housing 630 and maintains the rod 636 at a predetermined position.

The rod 636 is coupled to a rotary actuator 740 such as a stepper or servo motor. The rotary actuator is driven by a controller 232 in response to a pressure indicator 146, such as a manometer, that measures an indicia of pressure within the chamber volume 110.

The pressure control ring 601 comprises a first ring 610 supported by a second ring 620. The first ring 610 has a plurality of apertures 612 positioned about the first ring 610. A toothed aperture 614 is disposed on the first ring 610 to interface with a gear 702 connected to the end of the rod 636. Teeth of the gear 702 mesh with the toothed aperture 614 and cause the first ring 610 to rotate concentrically with the second ring 612 as the rod 636 rotates. Optionally, guides or bearings may be disposed on either the first ring 610, the second ring 612, the first liner 118 or the second liner 134 to maintain concentricity between the first ring 610 and the second ring 612 during rotation.

The second ring 620 has a plurality of apertures 622 positioned about the perimeter of the second ring 620. Separating the apertures 622 is a plurality of webs 626. A guide hole 624 is positioned to allow the rod 636 to pass through the second ring 620.

The apertures 622 are typically sized and distributed on the second ring 620 such that when the first ring 610 is rotated in one direction, the apertures 612 and 622 align and permit gas passage. As the shaft 632 is rotated to cause the first ring 610 to rotate in the other direction, the apertures 612 become increasingly obscured by the webs 626 of the second ring 620, decreasing the open area available for gas passage through the pressure control ring 601. When the first ring 610 is rotated completely to the other direction, the apertures are blocked by the webs 626. Thus, by rotating the first ring 610, the open area can be varied, controlling the gas flow through the pressure control ring 601.

Generally, the apertures 612 and 622 are substantially equivalent in size. Alternatively, apertures on one or both of the first and second rings 610 and 620 may be sized progressively smaller in open area relative to the apertures closest to the shaft with the apertures closest the exhaust side being the smallest. The variation in open area of the apertures creates a flow restriction on the exhaust side of the pressure control ring 601 that compensates for otherwise increased gas flow in the region of the chamber 600 closest the exhaust port 138, thus maintaining a uniform gas flow within the processing volume 112.

The reader should note that one skilled in the art will be able to devise other embodiments of the invention wherein a gap "G" for controlling gas flow is created between a pressure control ring and alternate components within a chamber. Additionally, it should be realized that the throttling ridge may be incorporated in other structures within the chamber not explicitly named above.

Referring to FIG. 2 and FIG. 3, in operation, processing of the substrate 128 is commenced by placing the substrate 128 upon the substrate support 124 within the chamber 100. The chamber volume 110 evacuated by the vacuum pump 111. The pressure sensor 146 provides a signal indicative of the pressure within the processing volume 112 to the controller 232. The controller 232, in response to the signal, and causes the ring actuator 105 to correspondingly raise or lower the pressure control ring 104. As the position of the pressure control ring 104 relative the throttling ridge 160 changes the cross-sectional area of the gap "G", the gases flowing through the gap "G" while being exhausted from the chamber 100 experiences a variable flow restriction which controls the pressure in the processing volume 112.

For example, if the sensor 146 indicates a pressure in the processing volume 112 in excess of a desired predetermined value, the controller 232 causes the ring actuator 105 to lower the pressure control ring 104. As the pressure control ring 104 moves away from the throttling ridge 160, the gap "G" widens and correspondingly reduces the flow restriction of the gases flowing through the gap "G". The reduced restriction and increased gas flow results in decreasing the pressure in the process volume 112.

Conversely, if the sensor 146 indicates a pressure less than the predetermined value, the controller 232 causes the ring actuator 105 to raise the pressure control ring 104. As the pressure control ring 104 moves closer to the throttling ridge 160, the gap "G" diminishes and correspondingly increases the flow restriction of the gases flowing through the gap "G". The increased restriction and decreased gas flow results in increasing the pressure in the process volume 112.

The controller 232, utilizing feedback from the sensor 146, causes the pressure control ring 104 to vary the gap "G" as needed thus maintaining the pressure in the processing volume 112 at the desired predetermined level.

Some advantages of the pressure control ring described above are that the higher pressure region (and pressure control volume) is confined to the area between the control ring and the lid assembly (i.e., the processing volume). As such, the plasma substantially remains in the processing volume and residence time of gases within the processing volume is minimized. This decreases the chamber service interval by preventing plasma induced chamber component erosions in areas beyond the processing volume and correspondingly increases tool capacity by reducing gas residence time (i.e., substrate throughput). Additionally, the cost of consumables (i.e., process kit components, liners, process and other gases, and other items) as minimized by decreasing the volume of the higher pressure region and correspondingly reducing the number of chamber and kit components exposed in that region.

Although the embodiment of the invention which incorporate the teachings of the present invention which has been shown and described in detail herein, those skilled in the art can readily devise other varied embodiments which still incorporate the teachings and do not depart from the spirit of the invention.

What is claimed is:

1. Apparatus for controlling pressure within a processing chamber comprising:
    a chamber comprising sidewalls, a chamber bottom and a lid defining a chamber volume;
    a throttling ridge disposed within the chamber volume; and,
    a pressure control ring movably disposed proximate the throttling ridge.

2. The apparatus of claim 1 further comprising:
    a liner disposed within the chamber volume proximate the sidewall, the throttling ridge projecting from the liner.

3. The apparatus of claim 1, wherein between the throttling ridge and the pressure control ring is defined a variable flow control orifice.

4. The apparatus of claim 1 further comprising:
    a ring actuator coupled to the pressure control ring.

5. The apparatus of claim 4 further comprising:
    a rod assembly coupled between the ring actuator and the pressure control ring.

6. The apparatus of claim 4, wherein the ring actuator further comprises:
    a stepper motor coupled to a controller.

7. The apparatus of claim 6 further comprising:
    a pressure sensor coupled to the controller, the pressure sensor providing an indicia of pressure within the chamber volume to the controller.

8. The apparatus of claim 5, wherein the rod assembly further comprises:
    a cam follower and a spring; and wherein the ring actuator further comprises;
    a cam driven by ring actuator, the spring providing a biasing force to maintain contact between the cam and the cam follower.

9. The apparatus of claim 1, wherein the distance between the throttling ridge and the pressure control ring varies along the perimeter of the pressure control ring.

10. The apparatus of claim 1, wherein the throttling ridge further comprises:
    a recess that mates with the pressure control ring.

11. The apparatus of claim 1, wherein the pressure control ring further comprises:
    a first ring having a plurality of apertures; and
    a second ring movably disposed proximate the first ring, the second ring having a plurality of apertures.

12. The apparatus of claim 11, wherein the first ring selectively rotates relative the second ring, the rotation controlling the open area through the control ring, the open area defined by the alignment of the apertures of the first ring with the apertures of the second ring.

13. Apparatus for controlling pressure within a processing chamber comprising:
    a chamber comprising sidewalls, a chamber bottom and a lid defining a chamber volume;
    a throttling ridge disposed within the chamber volume;
    a ring actuator coupled to the pressure control ring;
    a pressure sensor coupled to the ring actuator, the pressure sensor providing an indicia of pressure within the chamber volume to the ring actuator; and,
    a pressure control ring movably disposed proximate the throttling ridge, the throttling ridge and the pressure control ring defining a variable flow control orifice.

14. The apparatus of claim 13 further comprising:
    a liner disposed within the chamber volume proximate the sidewall, the throttling ridge projecting from the liner.

15. The apparatus of claim 13, wherein the distance between the throttling ridge and the pressure control ring varies along the perimeter of the pressure control ring.

16. The apparatus of claim 13, wherein the throttling ridge further comprises:
    a recess that mates with the pressure control ring.

17. The apparatus of claim 13 further comprising:
    a rod assembly coupled between the ring actuator and the pressure control ring, the rod assembly having a cam follower and a spring; and, wherein the ring actuator further comprises;
    a stepper motor coupled to a controller, the stepper motor driving a cam, wherein the spring provides a biasing force to maintain contact between the cam and the cam follower.

18. A method for controlling pressure within a processing chamber comprising the steps of:

sensing a pressure with the processing chamber; and, moving a pressure control ring within the processing chamber in response to the sensed pressure, the movement increasing or decreasing a flow restriction past the pressure control ring, the change in flow causing a corresponding change in chamber pressure.

19. The method of claim 18, wherein the moving step further comprises the step of:

mating an end of the pressure control ring with a recess in a throttling ridge.

20. The method of claim 18, wherein the moving step further comprises the step of:

driving a stepper motor to cause motion of the pressure control ring.

21. The method of claim 18 further comprising the step of:

repeating the sensing and the moving steps to maintain a predetermined pressure within the chamber.

* * * * *

UNITED STATES PATENT AND TRADEMARK OFFICE
CERTIFICATE OF CORRECTION

PATENT NO. : 6,261,408 B1
DATED : July 17, 2001
INVENTOR(S) : Schneider et al.

Page 1 of 1

It is certified that error appears in the above-identified patent and that said Letters Patent is hereby corrected as shown below:

<u>Column 4,</u>
Line 15, please replace "a and cam" with -- and a cam --.

Signed and Sealed this

Twenty-sixth Day of February, 2002

*Attest:*

*Attesting Officer*

JAMES E. ROGAN
*Director of the United States Patent and Trademark Office*